United States Patent
Chandrasekharan et al.

(10) Patent No.: US 10,157,755 B2
(45) Date of Patent: Dec. 18, 2018

(54) PURGE AND PUMPING STRUCTURES ARRANGED BENEATH SUBSTRATE PLANE TO REDUCE DEFECTS

(71) Applicant: Lam Research Corporation, Fremont, CA (US)

(72) Inventors: Ramesh Chandrasekharan, Portland, OR (US); Shankar Swaminathan, Beaverton, OR (US); Adrien Lavoie, Newberg, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 486 days.

(21) Appl. No.: 14/872,513

(22) Filed: Oct. 1, 2015

(65) Prior Publication Data

US 2017/0098556 A1   Apr. 6, 2017

(51) Int. Cl.
| | |
|---|---|
| *H01L 21/67* | (2006.01) |
| *H01L 21/683* | (2006.01) |
| *H01J 37/32* | (2006.01) |
| *C23C 16/50* | (2006.01) |
| *C23C 16/458* | (2006.01) |
| *C23C 16/44* | (2006.01) |
| *C23C 16/455* | (2006.01) |
| *C23C 16/46* | (2006.01) |

(52) U.S. Cl.
CPC .... *H01L 21/67069* (2013.01); *C23C 16/4412* (2013.01); *C23C 16/455* (2013.01); *C23C 16/458* (2013.01); *C23C 16/46* (2013.01); *C23C 16/50* (2013.01); *H01J 37/32009* (2013.01); *H01J 37/3244* (2013.01); *H01J 37/32715* (2013.01); *H01J 37/32834* (2013.01); *H01L 21/683* (2013.01); *H01J 2237/332* (2013.01); *H01J 2237/334* (2013.01)

(58) Field of Classification Search
CPC ............. H01L 21/67069; H01L 21/683; C23C 16/458; C23C 16/46; C23C 16/455; C23C 16/4412; C23C 16/50; H01J 37/32834; H01J 37/32715; H01J 37/3244; H01J 37/32009; H01J 2237/334; H01J 2237/332
USPC ......................... 118/715; 156/345.29, 345.33
See application file for complete search history.

(56) References Cited

U.S. PATENT DOCUMENTS

| | | | | |
|---|---|---|---|---|
| 5,441,568 A | * | 8/1995 | Cho | .................... C23C 16/4412 118/715 |
| 5,445,677 A | * | 8/1995 | Kawata | ................... C23C 16/04 118/724 |
| 5,884,009 A | * | 3/1999 | Okase | ............... H01L 21/67017 219/405 |
| 5,888,304 A | * | 3/1999 | Umotoy | ............ C23C 16/45521 118/500 |
| 6,014,943 A | * | 1/2000 | Arami | ............... H01J 37/32082 118/723 E |

(Continued)

*Primary Examiner* — Rudy Zervigon

(57) ABSTRACT

A substrate processing system includes a processing chamber including a top surface, a bottom surface and side walls. A substrate support is arranged in the processing chamber to support a substrate during processing. A purge structure is arranged in the processing chamber below a plane occupied by the substrate during processing. The purge structure includes a first plurality of holes configured to supply purge gas to purge an area between the substrate support and the bottom surface of the processing chamber.

17 Claims, 4 Drawing Sheets

(56) References Cited

U.S. PATENT DOCUMENTS

| | | | |
|---|---|---|---|
| 6,276,295 B1* | 8/2001 | Chen | H01L 21/76882 |
| | | | 118/723 MW |
| 6,531,069 B1* | 3/2003 | Srivastava | H01J 37/3244 |
| | | | 118/723 R |
| 6,702,900 B2* | 3/2004 | Yeh | H01L 21/67017 |
| | | | 118/730 |
| 6,812,157 B1* | 11/2004 | Gadgil | C23C 16/45551 |
| | | | 117/200 |
| 6,884,297 B2* | 4/2005 | Park | C23C 16/4412 |
| | | | 118/715 |
| 6,890,596 B2* | 5/2005 | Sarigiannis | C23C 16/4401 |
| | | | 134/1.1 |
| 7,468,104 B2* | 12/2008 | Mardian | C23C 16/4401 |
| | | | 118/715 |
| 7,601,224 B2* | 10/2009 | Foree | C23C 16/45521 |
| | | | 118/724 |
| 7,754,013 B2* | 7/2010 | Granneman | C23C 16/4411 |
| | | | 117/104 |
| 7,883,581 B2* | 2/2011 | Nakaiso | C23C 16/345 |
| | | | 118/696 |
| 8,394,199 B2* | 3/2013 | Tomita | H01L 21/67103 |
| | | | 118/715 |
| 8,696,814 B2* | 4/2014 | Morisaki | C23C 16/325 |
| | | | 118/666 |
| 8,858,754 B2* | 10/2014 | Horiguchi | H01J 37/3244 |
| | | | 118/723 E |
| 9,518,322 B2* | 12/2016 | Ito | C30B 25/10 |
| 9,570,337 B2* | 2/2017 | Ito | |
| 9,589,818 B2* | 3/2017 | Tasaka | H01L 21/67051 |
| 9,779,918 B2* | 10/2017 | Lee | H01J 37/32834 |
| 9,852,905 B2* | 12/2017 | Sung | C23C 16/45502 |
| 2002/0134514 A1* | 9/2002 | Yeh | H01L 21/67017 |
| | | | 156/345.55 |
| 2004/0129218 A1* | 7/2004 | Takahashi | H01J 37/32834 |
| | | | 118/715 |
| 2013/0224962 A1* | 8/2013 | Koelmel | C23C 16/4584 |
| | | | 438/746 |
| 2013/0344245 A1 | 12/2013 | Xia et al. | |
| 2015/0187545 A1* | 7/2015 | Lee | H01J 37/32834 |
| | | | 216/67 |
| 2017/0098556 A1* | 4/2017 | Chandrasekharan | H01L 21/67069 |

* cited by examiner

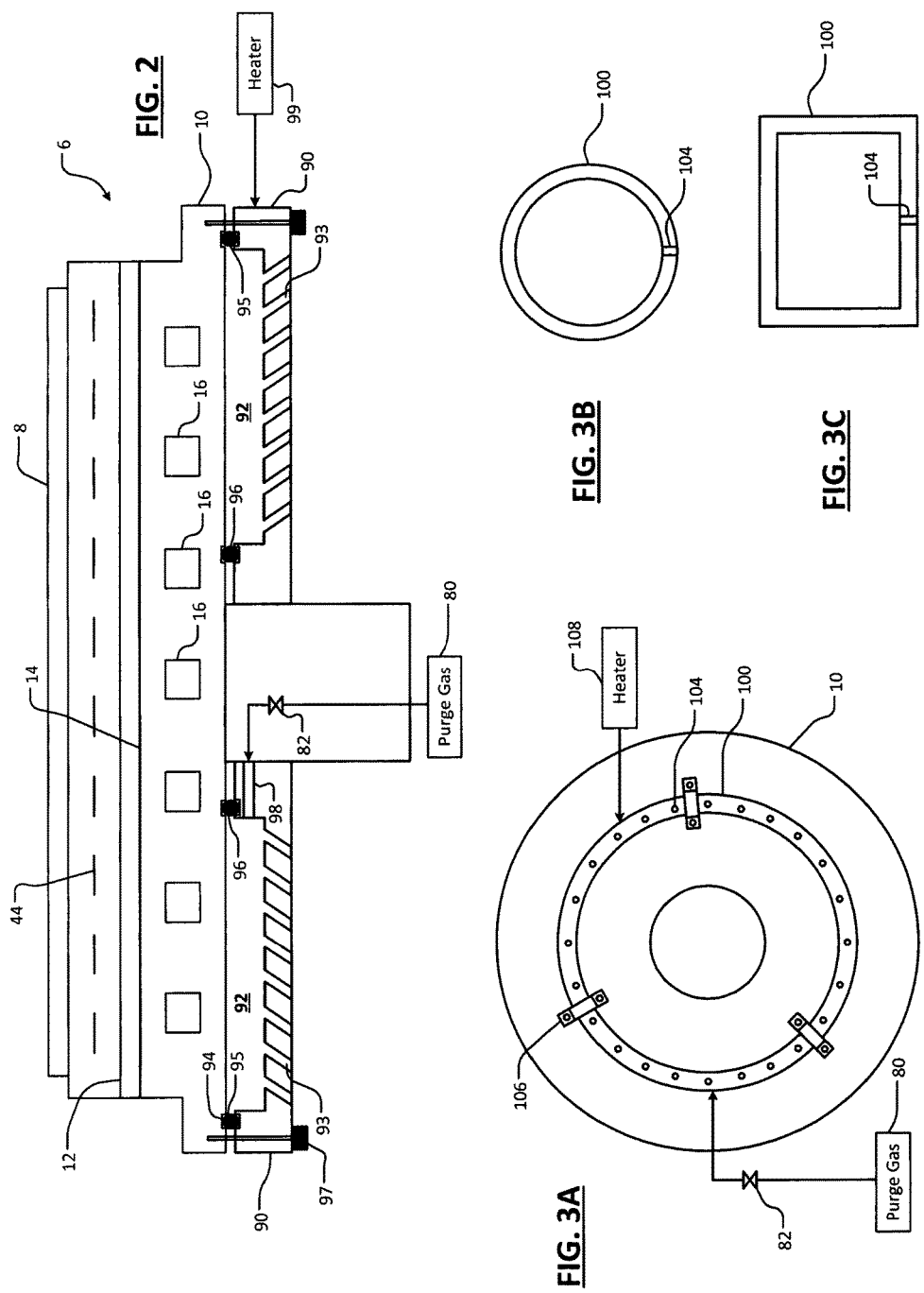

PURGE AND PUMPING STRUCTURES ARRANGED BENEATH SUBSTRATE PLANE TO REDUCE DEFECTS

FIELD

The present disclosure relates to substrate processing systems, and more particularly to purge structures and/or pumping structures arranged beneath a substrate plane to reduce defects.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems for performing deposition and/or etching typically include a processing chamber, a gas distribution device such as a showerhead and a substrate support. A substrate such as a semiconductor wafer may be arranged on the substrate support. During processing, different gas mixtures may be introduced into the processing chamber and then evacuated. The process is repeated multiple times to deposit film, to etch the substrate or to perform other substrate treatment. In some substrate processing systems, radio frequency (RF) plasma may be used to activate chemical reactions.

Some substrate processing systems use a reaction zone between the substrate and the gas distribution device. The reaction zone may be isolated from a large processing chamber volume using a gas curtain. The large chamber volume helps to mitigate parasitic coupling to grounded processing chamber walls (due to the increased distance). However, the large chamber volume also has dead volumes that can accumulate particles, which may increase defects.

SUMMARY

A substrate processing system includes a processing chamber including a top surface, a bottom surface and side walls. A substrate support is arranged in the processing chamber to support a substrate during processing. A purge structure is arranged in the processing chamber below a plane occupied by the substrate during processing. The purge structure includes a first plurality of holes configured to supply purge gas to purge an area between the substrate support and the bottom surface of the processing chamber.

In other features, the first plurality of holes directs purge gas in a downwardly direction towards the bottom surface of the processing chamber. The first plurality of holes directs purge gas in a downwardly and radially outwardly direction. The purge structure is connected to a bottom surface of the substrate support. The purge structure includes a body and a plenum defined in the body. The first plurality of holes is formed in the body and is in fluid communication with the plenum.

In other features, the purge structure includes a body and a cavity defined in the body. The first plurality of holes is formed in the body and is in fluid communication with the cavity. The cavity and a bottom surface of the substrate support form a plenum.

In other features, the purge structure includes an elongate member that is attached to a bottom surface of the substrate support. The substrate support includes a central supporting member connecting the substrate support to the bottom surface of the processing chamber. The processing chamber further includes exhaust pumping ports.

In other features, a pumping structure arranged below the substrate support and around the central supporting member. The pumping structure includes a second plurality of holes for controlling flow from the processing chamber through the pumping structure to the exhaust pumping ports.

In other features, the pumping structure includes a first portion arranged around the central supporting member and a second portion connected to the first portion and extending from the first portion to the side walls of the processing chamber. The second plurality of holes of the pumping structure is arranged at spaced locations on the second portion.

In other features, the first portion includes a cylindrical portion and the second portion includes a planar portion.

In other features, the planar portion has a cross-section to mate with a bottom portion of the processing chamber and to define a first volume in fluid communication with a reaction zone and second volume in fluid communication with vacuum. The first plurality of holes fluidly connect the first volume with the second volume.

In other features, a heater heats the purge structure to a predetermined temperature. A heater heats the pumping structure to a predetermined temperature.

A substrate processing system includes a processing chamber including a top surface, a bottom surface and side walls and exhaust pumping ports. A substrate support is arranged in the processing chamber to support a substrate during processing, wherein the substrate support includes a central supporting member connecting the substrate support to the bottom surface of the processing chamber. A pumping structure is arranged in the processing chamber below the substrate support and around the central supporting member. The pumping structure includes a first plurality of holes for controlling flow from the processing chamber through the pumping structure to the exhaust pumping ports.

The pumping structure includes a first portion arranged around the central supporting member and a second portion connected to the first portion and extending from the first portion to the side walls of the processing chamber. The first plurality of holes of the pumping structure is arranged at spaced locations on the second portion.

In other features, the first portion includes a cylindrical portion and the second portion includes a planar portion. The planar portion has a cross-section to mate with a bottom portion of the processing chamber and to define a first volume in fluid communication with a reaction zone and second volume in fluid communication with vacuum. The first plurality of holes fluidly connects the first volume with the second volume.

In other features, a heater heats the pumping structure to a predetermined temperature.

In other features, a purge structure is arranged in the processing chamber below a plane defined by the substrate during processing. The purge structure includes a plenum and a second plurality of holes configured to flow purge gas from the plenum through the second plurality of holes to purge an area between the substrate support and the bottom surface of the processing chamber.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 2 is a side cross-sectional view another example of a purge structure according to the present disclosure;

FIG. 3A is a plan view of a bottom of a lower electrode illustrating another example of a purge structure according to the present disclosure;

FIGS. 3B and 3C are side cross-sectional views of examples of the purge structure in FIG. 3A;

In the drawings, reference numbers may be reused to identify similar and/or identical elements.

DETAILED DESCRIPTION

Typically, there are two dead volumes in processing chambers. One dead volume is located above a horizontal plane of the gas distribution device. Another dead volume is located below a horizontal plane including the substrate. The dead volume above the plane of the gas distribution device may be managed by purge gas emanating from a collar arranged on a stem of the gas distribution device. The gas curtain prevents back-streaming of reaction gases from the reaction zone, which reduces particle accumulation. The substrate processing system according to the present disclosure includes a purge structure and/or a pumping structure located in the dead volume beneath the substrate.

Figure 1:
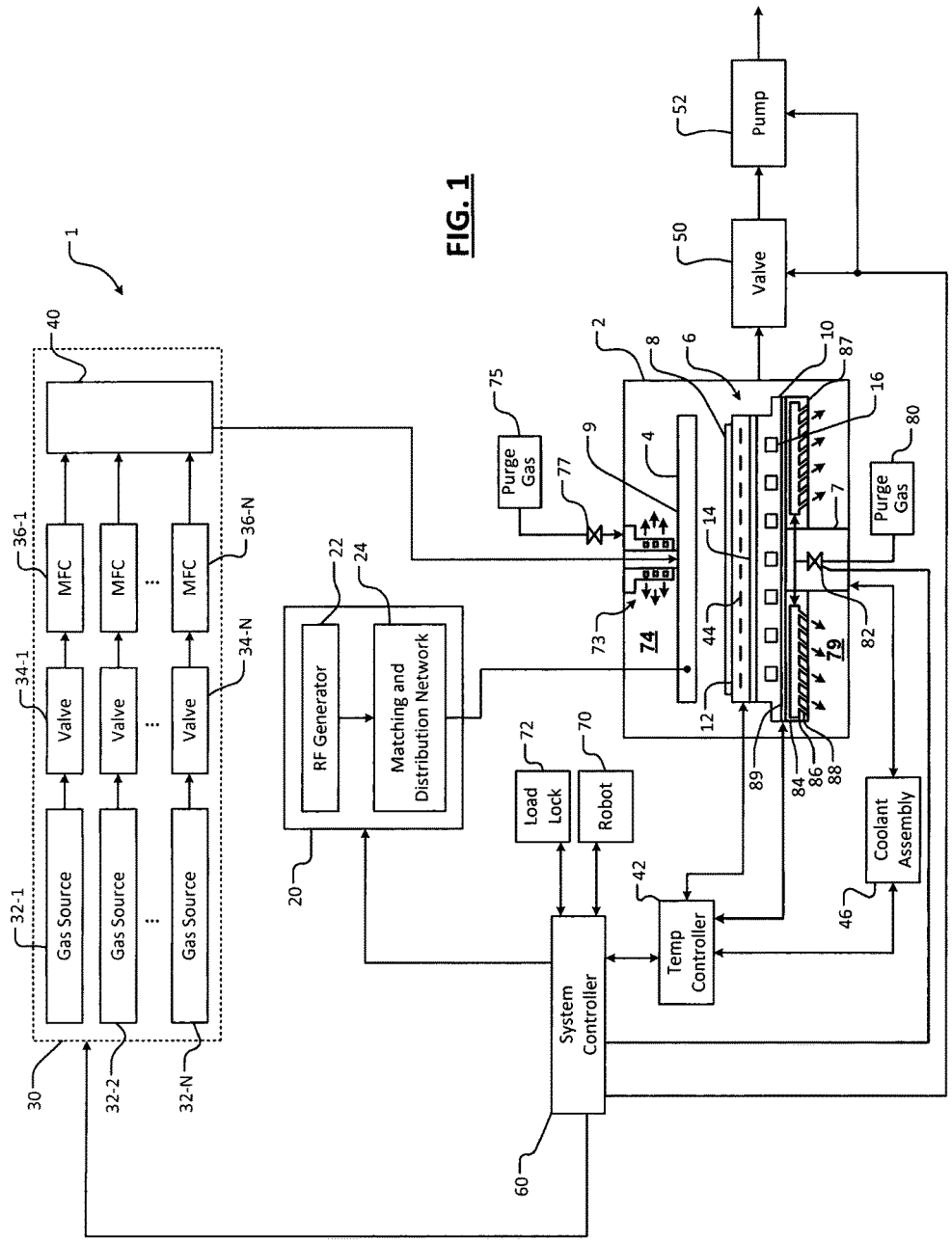
FIG. 1 is a functional block diagram and partial side cross-sectional view of an example of a substrate processing system including a purge structure arranged beneath a substrate support according to the present disclosure.

Referring now to FIG. 1, an example substrate processing system 1 is shown. While the foregoing example will be described in the context of plasma enhanced atomic layer deposition (PEALD), the present disclosure may be applied to other substrate processing systems such as chemical vapor deposition (CVD), PECVD, ALE, ALD, PEALE or other substrate treatment. The substrate processing system 1 includes a processing chamber 2 that encloses other components of the substrate processing system 1 and contains the RF plasma (if used). The processing chamber 2 includes a top surface, a bottom surface, and side surfaces.

The substrate processing system 1 includes an upper electrode 4 and a substrate support 6. In some examples, the substrate support 6 includes an electrostatic chuck. During operation, a substrate 8 is arranged on the substrate support 6. The substrate support 6 may include a central column or supporting member 7 connecting the substrate support 6 in a spaced relationship relative to the bottom surface of the processing chamber 2.

For example only, the upper electrode 4 may include a gas distribution device 9 such as a showerhead that introduces and distributes process gases. The gas distribution device 9 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 4 may include a conducting plate and the process gases may be introduced in another manner.

In some examples, the substrate support 6 may include a lower electrode 10. The lower electrode 10 may support a heating plate 12, which may correspond to a ceramic multi-zone heating plate. A thermal resistance layer 14 may be arranged between the heating plate 12 and the lower electrode 10. The lower electrode 10 may include one or more coolant channels 16 for flowing coolant through the lower electrode 10.

An RF generating system 20 generates and outputs an RF voltage to one of the upper electrode 4 and the lower electrode 10. The other one of the upper electrode 4 and the lower electrode 10 may be DC grounded, AC grounded or floating. For example only, the RF generating system 20 may include an RF generator 22 that generates RF power that is fed by a matching and distribution network 24 to the upper electrode 4 or the lower electrode 10. In other examples, the plasma may be generated inductively or remotely.

A gas delivery system 30 includes one or more gas sources 32-1, 32-2, . . . , and 32-N (collectively gas sources 32), where N is an integer greater than zero. The gas sources 32 are connected by valves 34-1, 34-2, . . . , and 34-N (collectively valves 34) and mass flow controllers 36-1, 36-2, . . . , and 36-N (collectively mass flow controllers 36) to a manifold 40.

A temperature controller 42 may be connected to a plurality of thermal control elements (TCEs) 44 arranged in the heating plate 12. The temperature controller 42 may be used to control the plurality of TCEs 44 to control a temperature of the substrate support 6 and the substrate 8. The temperature controller 42 may communicate with a coolant assembly 46 to control coolant flow through the channels 16. For example, the coolant assembly 46 may include a coolant pump and reservoir. The temperature controller 42 operates the coolant assembly 46 to selectively flow the coolant through the channels 16 to cool the substrate support 6.

A valve 50 and pump 52 may be used to evacuate reactants from the processing chamber 2. A system controller 60 may be used to control components of the substrate processing system 1. A robot 70 may be used to deliver substrates onto, and remove substrates from, the substrate support 6. For example, the robot 70 may transfer substrates between the substrate support 6 and a load lock 72.

A purge structure 73 such as a collar with slots may be used to provide purge gas in an area 74 above a showerhead. A purge gas source 75 and a valve 77 supply the purge gas to the purge structure 73. The system controller 60 may be used to control the valve 77. Suitable purge structures are shown and described in commonly-assigned U.S. patent application Ser. No. 13/659,231, filed on Oct. 24, 2012 and entitled "Suppression of Parasitic Deposition in a Substrate Processing System By Suppressing Precursor Flow and Plasma Outside of Substrate Region", which is hereby incorporated by reference in its entirety.

A purge structure 84 according to the present disclosure provides purge gas in an area 79 below the substrate support 6. A purge gas source 80 supplies purge gas via a valve 82 to the purge structure 84. In some examples, the system controller 60 controls the valve 82. The purge structure 84 includes a plenum 86 in fluid communication with a plurality of holes 88. In some examples, the purge structure 84 includes an annular body 87 and the plenum 86 has an annular shape.

As the purge gas is supplied into the plenum 86, pressure increases in the plenum 86 and the purge gas flows through the plurality of holes 88 into the dead volume beneath the substrate support 6. In some examples, the plurality of holes 88 is directed downwardly in a direction perpendicular to a plane occupied by the substrate 8. In other examples, the plurality of holes 88 is directed downwardly and radially outwardly at an angle between a first direction perpendicular to the plane of the substrate 8 and a second direction parallel to the plane of the substrate 8 (as shown).

A temperature of the purge structure 84 may be controlled by the temperature controller 42. In some examples, the temperature of the purge structure 84 may be sensed using a sensor (not shown) and fed back to the temperature controller 42. In other examples, open-loop control of heat supplied to the purge structure 84 can be used. For example only, a film heater 89 may be arranged between the purge structure 84 and the bottom surface of the lower electrode 10 (or on another surface of the purge structure 84), although other types of heaters may be used.

Referring now to FIG. 2, another example of a purge structure 90 according to the present disclosure is shown. The purge structure 90 defines a plenum 92 in conjunction with a bottom surface of the lower electrode 10. A plurality of holes 93 supplies purge gas from the plenum 92 to the area 76 beneath the substrate support 6. The plurality of holes 93 may be directed downwardly or downwardly and radially outwardly as described above.

In some examples, "O"-rings 95 and 96 may be arranged in slots 94 formed in the bottom surface of the lower electrode 10 and the purge structure 90 to provide a seal. In addition, fasteners 97 may also be used to hold the plenum 92 against the bottom surface of the lower electrode 10. Purge gas is supplied via the valve 82 and one or more passages 98 to the plenum 92. While a specific arrangement of fasteners, slots and "O"-rings is disclosed, other arrangements can be used to seal the plenum 92 against the bottom surface of the lower electrode 10. A heater 99 may be used to heat the purge structure 90 as described above.

Referring now to FIG. 3A-3C, another example of a purge structure 100 according to the present disclosure is shown. The purge structure 100 includes an elongate member such as a tube including a plurality of holes 104 on a bottom-facing surface thereof. For example only, the annular tube can be in the form of a continuous or discontinuous ring. While a circular cross-section may be used, other cross-sections such as square, elliptical rectangular, etc. may be used as shown in the examples in FIGS. 3B and 3C. In some examples, the purge structure 100 is attached to the bottom surface of the lower electrode 10 using fasteners 106 or another attachment mechanism. The plurality of holes 104 in the purge structure may be directed downwardly or downwardly and outwardly as described above. A heater 108 may be used to heat the purge structure 100.

Figure 4:
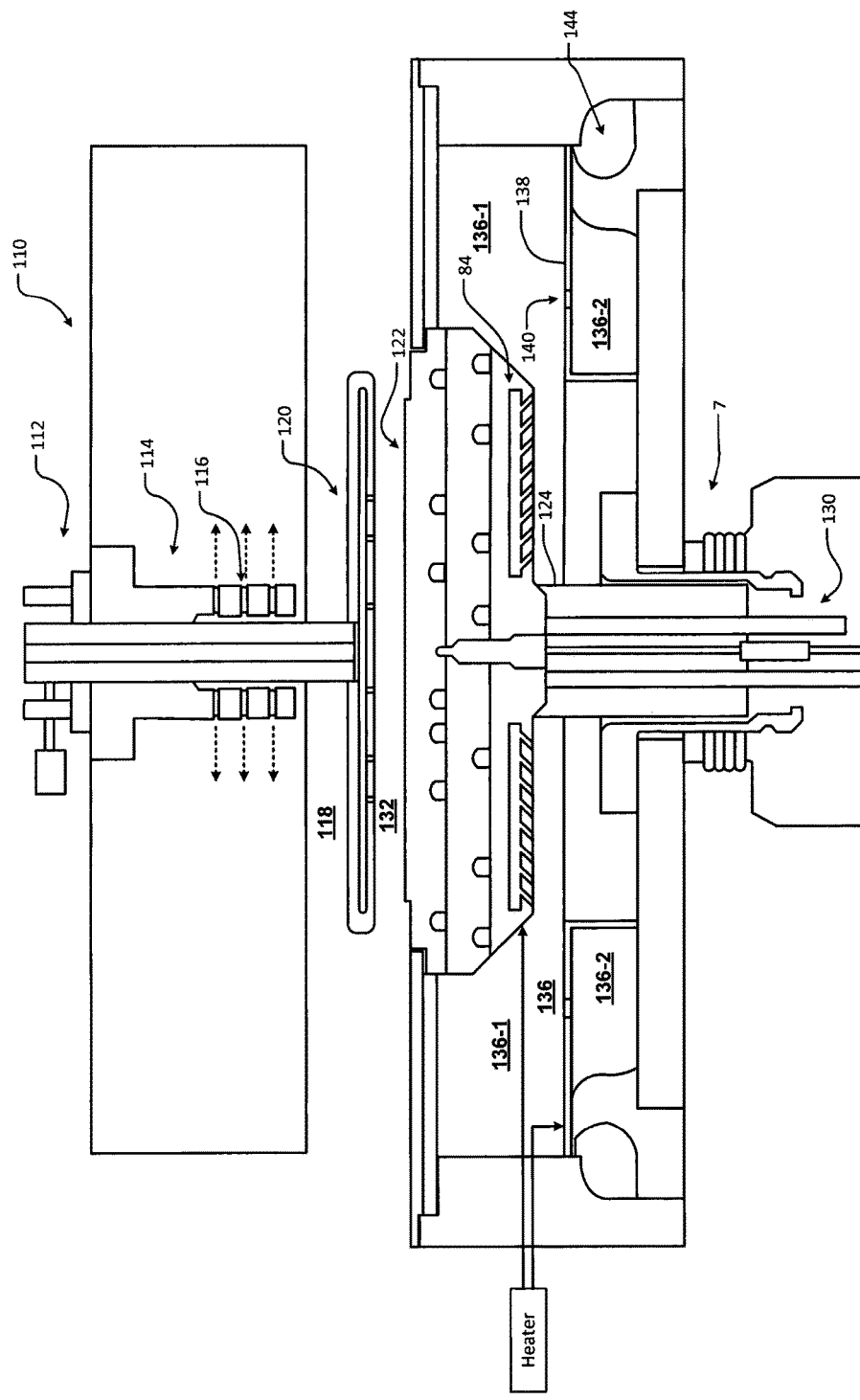
FIG. 4 is a side cross-sectional view of an example of a substrate processing chamber including a purge structure and a pumping structure arranged beneath a substrate support according to the present disclosure.
Figure 5:
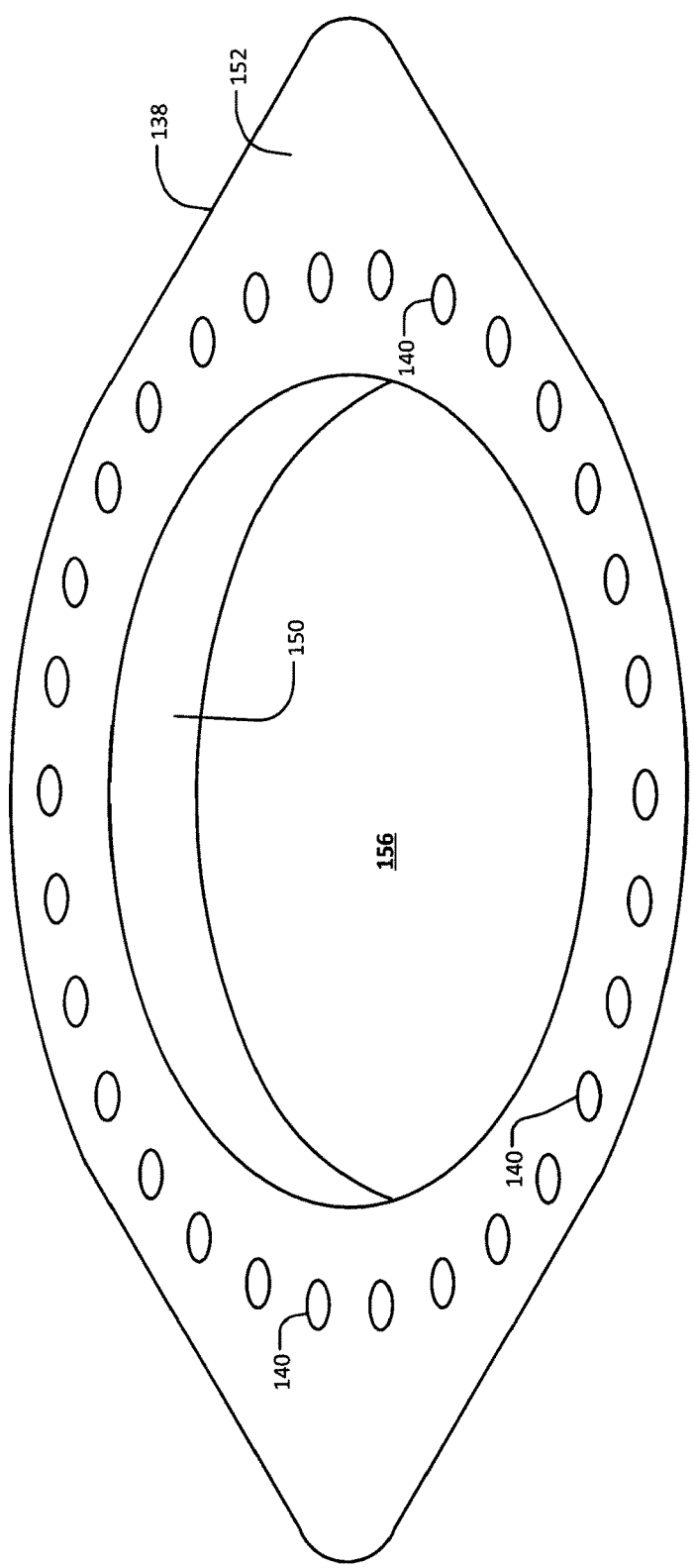
FIG. 5 is a perspective view of the pumping structure of FIG. 4.

Referring now to FIGS. 4 and 5, a substrate processing chamber 110 includes the purge structure 84 described above and/or a pumping structure arranged beneath the substrate support. In FIG. 4, process gas, purge gas and electrical connections for an upper portion of the processing chamber are generally identified at 112. A collar 114 including a plurality of slots 116 may be used to supply purge gas in an area 118 located between a showerhead 120 and an upper surface of the processing chamber.

Process gas is supplied to an area between the showerhead 120 and a substrate arranged on a substrate support 122. Process gas, purge gas and electrical connections for a lower portion of the processing chamber are located in the center column 7. The purge structure 84 and a pumping structure 138 may be used to help control gas flow in a volume 136 below the substrate support 122 as will be described further below.

The pumping structure 138 divides the volume 136 into an upper volume 136-1 located above the pumping structure 138 and a lower volume 136-2 located below the pumping structure 138. The upper volume 136-1 receives process gas, purge gas and process reactants from a process being performed in the processing chamber. The pumping structure 138 includes a plurality of holes 140 to draw gas flow from the upper volume 136-1 to the lower volume 136-2. The lower volume 136-2 is in fluid communication with exhaust openings, which are connected to a vacuum source and are used to remove reactants from the processing chamber.

In FIG. 5, an example of the pumping structure 138 is shown to include a first portion 150 that is connected to a second portion 152. The first portion 150 may be connected generally perpendicular to the second portion 152. The first portion 150 may have a generally cylindrical shape. The second portion 152 may be planar and may have a football-shaped cross section and a center opening 156. The plurality of holes 140 may be arranged on the second portion 152 arranged at a plurality of spaced locations around the second portion 152. While a specific football-shaped structure is shown, the pumping structure 138 may have circular, elliptical, rectangular, or any suitable shape that mates with an inner surface of the processing chamber to provide the separate volumes 136-1 and 136-2.

The dead zone located beneath the substrate support was not previously actively purged and surfaces in this region tend to be cooler than the substrate support. Therefore, there was a potential for enhanced precursor adsorption and reaction with oxidizing or clean gas radicals with long mean free paths. As a result, parasitic oxide or CF) type formation occurred. The non-volatile residues build up over time and may increase substrate defects.

The purging structure and/or pumping structures according to the present disclosure help to manage a conductance path for reactive species, which reduces defects and improves wafer uniformity.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system comprising:
    a processing chamber including a top surface, a bottom surface and side walls;
    a substrate support arranged in the processing chamber to support a substrate during processing; and
    a purge structure arranged in the processing chamber below a plane occupied by the substrate during processing,
    wherein the purge structure includes a body sealed against a bottom surface of the substrate support to define a plenum between the purge structure and the bottom surface of the substrate support, wherein the plenum is configured to receive purge gas supplied from below the substrate support, and
    wherein the purge structure includes a first plurality of holes formed in the body and configured to supply the purge gas from the plenum to purge an area between the substrate support and the bottom surface of the processing chamber, wherein the plurality of holes is distributed along different radial distances on a bottom surface of the body.

2. The substrate processing system of claim 1, wherein the first plurality of holes directs purge gas in a downwardly direction towards the bottom surface of the processing chamber.

3. The substrate processing system of claim 1, wherein the first plurality of holes directs purge gas in a downwardly and radially outwardly direction.

4. The substrate processing system of claim 1, wherein the purge structure is connected to the bottom surface of the substrate support.

5. The substrate processing system of claim 1, wherein the purge structure includes an elongate member that is attached to the bottom surface of the substrate support.

6. The substrate processing system of claim 1, wherein the substrate support includes a central supporting member connecting the substrate support to the bottom surface of the processing chamber.

7. The substrate processing system of claim 6, further comprising a pumping structure arranged below the substrate support and around the central supporting member, wherein the pumping structure includes a second plurality of holes for controlling flow from the processing chamber through the pumping structure.

8. The substrate processing system of claim 7, wherein the pumping structure includes:
   a first portion arranged around the central supporting member; and
   a second portion connected to the first portion and extending from the first portion to the side walls of the processing chamber, wherein the second plurality of holes of the pumping structure is arranged at spaced locations on the second portion.

9. The substrate processing system of claim 8, wherein the first portion has a cylindrical shape and the second portion is planar.

10. The substrate processing system of claim 9, wherein the planar portion has a cross-section to mate with a bottom portion of the processing chamber and to define a first volume in fluid communication with a reaction zone and second volume in fluid communication with vacuum and wherein the first plurality of holes fluidly connects the first volume with the second volume.

11. The substrate processing system of claim 1, further comprising a heater to heat the purge structure to a predetermined temperature.

12. The substrate processing system of claim 7, further comprising a heater to heat the pumping structure to a predetermined temperature.

13. A substrate processing system comprising:
   a processing chamber including a top surface, a bottom surface and side walls;
   a substrate support arranged in the processing chamber to support a substrate during processing, wherein the substrate support includes a central supporting member connecting the substrate support to the bottom surface of the processing chamber;
   a purge structure including a body sealed against a bottom surface of the substrate support to define a plenum between the purge structure and the bottom surface of the substrate support, wherein the plenum is configured to receive purge gas supplied from below the substrate support, and
   a pumping structure arranged in the processing chamber below the substrate support and around the central supporting member, wherein the pumping structure includes a first plurality of holes to control flow from the processing chamber through the pumping structure,
   wherein the purge structure includes a second plurality of holes configured to flow the purge gas from the plenum through the second plurality of holes to purge an area between the substrate support and the bottom surface of the processing chamber, wherein the second plurality of holes is distributed along different radial distances on a bottom surface of the body.

14. The substrate processing system of claim 13, wherein the pumping structure includes:
   a first portion arranged around the central supporting member; and
   a second portion connected to the first portion and extending from the first portion to the side walls of the processing chamber, wherein the first plurality of holes of the pumping structure is arranged at spaced locations on the second portion.

15. The substrate processing system of claim 14, wherein the first portion has a cylindrical shape and the second portion is planar.

16. The substrate processing system of claim 13, wherein the planar portion has a cross-section to mate with a bottom portion of the processing chamber and to define a first volume in fluid communication with a reaction zone and second volume in fluid communication with vacuum and wherein the first plurality of holes fluidly connect the first volume with the second volume.

17. The substrate processing system of claim 13, further comprising a heater to heat the pumping structure to a predetermined temperature.

* * * * *